US 6,534,404 B1

(12) United States Patent
Danek et al.

(10) Patent No.: US 6,534,404 B1
(45) Date of Patent: Mar. 18, 2003

(54) METHOD OF DEPOSITING DIFFUSION BARRIER FOR COPPER INTERCONNECT IN INTEGRATED CIRCUIT

(75) Inventors: Michal Danek, Sunnyvale; Karl B. Levy, Los Altos; Hyoun S. Choe, La Palma, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/449,008

(22) Filed: Nov. 24, 1999

(51) Int. Cl.$^7$ .......................... H01L 21/44; H01L 21/31
(52) U.S. Cl. ............... 438/680; 438/681; 438/685; 438/758
(58) Field of Search ................ 438/681, 680, 438/758, 653, 685

(56) References Cited

U.S. PATENT DOCUMENTS

| | | | | |
|---|---|---|---|---|
| 4,830,982 A | * | 5/1989 | Dentai et al. ............... 437/94 |
| 4,844,006 A | * | 7/1989 | Page, Jr. et al. ............ 118/719 |
| 4,908,243 A | * | 3/1990 | Page, Jr. et al. ............ 425/445 |
| 5,178,911 A | * | 1/1993 | Gordon et al. ............ 427/255.2 |
| 5,416,359 A | | 5/1995 | Oda ........................... 257/750 |
| 5,641,992 A | | 6/1997 | Lee et al. ................... 257/762 |
| 5,770,520 A | * | 6/1998 | Zhao et al. ................. 438/653 |
| 5,834,068 A | * | 11/1998 | Chern et al. ................ 427/535 |
| 5,942,799 A | | 8/1999 | Danek et al. .............. 257/751 |
| 6,017,818 A | * | 1/2000 | Lu ............................. 438/653 |
| 6,159,855 A | * | 12/2000 | Vaartstra ..................... 438/681 |
| 6,194,310 B1 | * | 7/2001 | Hsu et al. .................. 488/643 |
| 6,271,136 B1 | * | 8/2001 | Shue et al. ................. 638/687 |

FOREIGN PATENT DOCUMENTS

| | | | |
|---|---|---|---|
| JP | 4-27163 | 1/1992 | ............. 257/751 |
| WO | 086001640 | 3/1986 | ............. 257/751 |

OTHER PUBLICATIONS

K.K. Shih et al., "Ti/Ti–N Hf/Hf–N and W/W–N multilayer films with high mechanical hardness," Appl. Phys. Lettt. 61(6), Aug. 10, 1992, pp. 654–656.
Chang Woo Lee et al., "Stress relaxation in plasma deposited tungsten nitride/tungsten bilayer," Appl. Phys. Lett. 65(8), Aug. 22, 1994, pp. 965–967.
Hideaki Ono et al., "Diffusion Barrier Effects Against Cu of W–N Layer Formed by Electron Cyclotron Resonance Plasma Nitridation on W Layer," Jpn. J. Appl. Phys., vol. 34, (1995), pp. 1827–1830.
J. P. Lu et al., "A New Method for Processing TiN–based Barrier Films through Thermal Decomposition of TDMAT Combined with Post–deposition Silane Anneal," Advanced Metallization and Interconnect Systems for ULSI Applications; Oct. 1996, Boston; Proceedings, pp. 45–48.

* cited by examiner

Primary Examiner—Michael S. Lebentritt
(74) Attorney, Agent, or Firm—Skjerven Morrill LLP

(57) ABSTRACT

Diffusion barriers are used in integrated circuits. The present method of depositing diffusion barriers eliminates the formation of high resistivity phases, providing high electrical conductivity and diffusion suppression between the interconnect conductors, for example copper, and the semiconductor device. In a preferred embodiment, the diffusion barrier is formed by depositing a film of binary transition metal nitride then treating the film in a gas containing silicon in order to form a layer of silicon rich material on the surface of the binary transition metal nitride film.

25 Claims, 6 Drawing Sheets

METHOD OF DEPOSITING DIFFUSION BARRIER FOR COPPER INTERCONNECT IN INTEGRATED CIRCUIT

FIELD OF THE INVENTION

This invention relates to a method for depositing diffusion barriers for integrated circuit applications and particularly for copper interconnections. This invention is related to U.S. patent application Ser. No. 08/974,451, titled "Multilayer Diffusion Barriers," Danek, et al., filed on Nov. 20, 1997 and assigned to Novellus Systems, Inc., now U.S. Pat. No. 5,942,799, issued Aug. 24, 1999, which is incorporated herein by reference in its entirety.

BACKGROUND OF THE INVENTION

Copper is widely recognized as an attractive replacement for aluminum as an interconnect conductor in integrated circuits. However, copper diffuses into silicon and intermetal dielectrics at the contact regions, causing device leakage and failure in manufacture or operation.

Ultrathin, highly conformal diffusion barriers are required for the manufacture of advanced integrated circuits with copper interconnections, to prevent copper diffusion into silicon and intermetal dielectrics. Conventional barrier materials, such as films of physical vapor deposition (PVD) Ta, TaN, or TiN and chemical vapor deposition (CVD) TiN, become unreliable at thicknesses below 50 Å because open grain boundaries result in fast copper diffusion through the barrier film. The diffusion at the grain boundaries is significantly accelerated under elevated temperature and electrical bias.

Grain boundary diffusion is a known failure mechanism for copper barriers (M. A. Nicolet Appl. Surface Sci. 91,269 (1995)). In order to improve barrier reliability, films of amorphous silicon nitride ternaries have been proposed (E. Kolowa et al., IEEE Elec. Dev. Lett. 12,321 (1991); J. S. Reid et al., J. Mater. Res. 7,2424 (1992); E. Kolowa et al., Thin Solid Films 236,301 (1993); J. S. Reid, et al., Thin Solid Films 262,218 (1995); P. M. Smith et al., VMIC, 6/18–6/20, 1996; X. Sun et al., J. Appl. Phys. 81,664 (1997)). Though the ternary films show excellent barrier properties, their resistivity is high, typically 1000–10000 $\mu\Omega$ cm. In addition, the stoichiometry of ternary barrier films is difficult to control and leads to variations in electrical and barrier properties across the wafer as well as across the device features.

Post deposition silane treatment has been described as a method for improving the stability and the electrical properties of CVD titanium carbonitride [TiN(C)] (J. P. Lu, et al., presented at Advanced Metalization and Interconnect Systems for ULSI, Boston, 1996; J. P. Lu et al., Spring MRS Meeting '98, San Francisco, 1998). In this method, the starting material is porous and highly reactive TiN(C). During the treatment, XPS spectroscopy reveals silane reacting within the bulk of the film to form an insulating SiNe phase. Thus, despite improvement in the film stability, silane-treated films still suffer from high resistivity, about 2,000 $\mu\Omega$ Q cm. Subsequent $N_2/H_2$ plasma treatment has been attempted to correct this problem.

What is needed in the art is a method of depositing a diffusion barrier that incorporates silicon into the grain boundaries in order to suppress copper diffusion, but does not form high resistivity silicon nitride ternaries.

SUMMARY OF THE INVENTION

In accordance with the invention, a barrier film is deposited on a semiconductor wafer by alternating chemical vapor deposition of a film of binary transition metal nitride and in-situ thermal treatment of the deposited film in a gas containing silicon. The treatment step is done under low pressure and results in formation of an ultrathin layer of silicon rich material at the exposed interface. This layer blocks the film grain boundaries and prevents diffusion of the conductor metal, specifically copper, into the underlying substrate and the surrounding intermetal dielectric. Since the formation of the silicon rich layer is self-limiting, its thickness is only a few angstroms. Thus, the overall electrical properties of the barrier are unaffected.

In a preferred embodiment, a TiN film is deposited from tetrakis (dimethylamido) titanium and ammonia in a conventional multistation deposition system (for example, Novellus Systems' CVD TiN Prism) or in a single-station deposition system (for example, Novellus Systems' CVD TiN Inova). The thickness of each layer is 10–200 Å, preferably 50 Å. After the TiN film is deposited, the flow of the precursors is discontinued, and the reactor is purged with nitrogen. The surface of the film is then treated with silane for 5–60 seconds, preferably 10 seconds, at pressure 0.1–100 Torr, preferably 2 Torr. After completion of the silane treatment, the reactor is again purged with nitrogen, and the wafer is transferred to the next pedestal. The sequence is repeated until the desired number of layers has been formed. This sequential deposition produces a TiN(Si) film with 1–10 layers, preferably 6. The top TiN sublayer may be silane treated or left as deposited. The post deposition treatment in silane eliminates direct formation of the high resistivity ternary phases. The formation of TiN(Si) is limited to the grain boundaries and does not affect the overall film sheet resistance. The silicon rich layer suppresses copper diffusion without affecting conductivity.

In another preferred embodiment the deposition and treatment of the film are performed in a conventional CVD chamber with one deposition station, known as a single wafer module. The process sequence is similar to that in the first embodiment with the exception that the wafer remains on the same pedestal during processing. The sequential process yields multilayer TiN(Si) film. The number of the layers is 1–10, preferably 1 or 2.

Variants of these embodiments can be obtained by treating other transition metal nitrides, such as CVD TaN or CVD $WN_x$ with silane or other silicon containing gases, such as $Si_2H_6$, $Si_3H_6$, $SiH_nX_{4-n}$, where X is a halide.

Another advantage of the invention is that it improves copper wetability of the film surface. This is potentially important for improving copper adhesion and damascene trench fill.

It has been found that the treated TiN film is less susceptible to surface oxidation. This effect may be also important for improving properties of CVD TiN for CVD W plug applications.

Potential applications of the invention include the formation of diffusion barriers for copper interconnects, W-plugs, and DRAM capacitors.

DETAILED DESCRIPTION OF THE EMBODIMENTS

The present invention relates to a method for depositing diffusion barriers for integrated circuit applications and particularly for copper interconnections.

Figure 1:
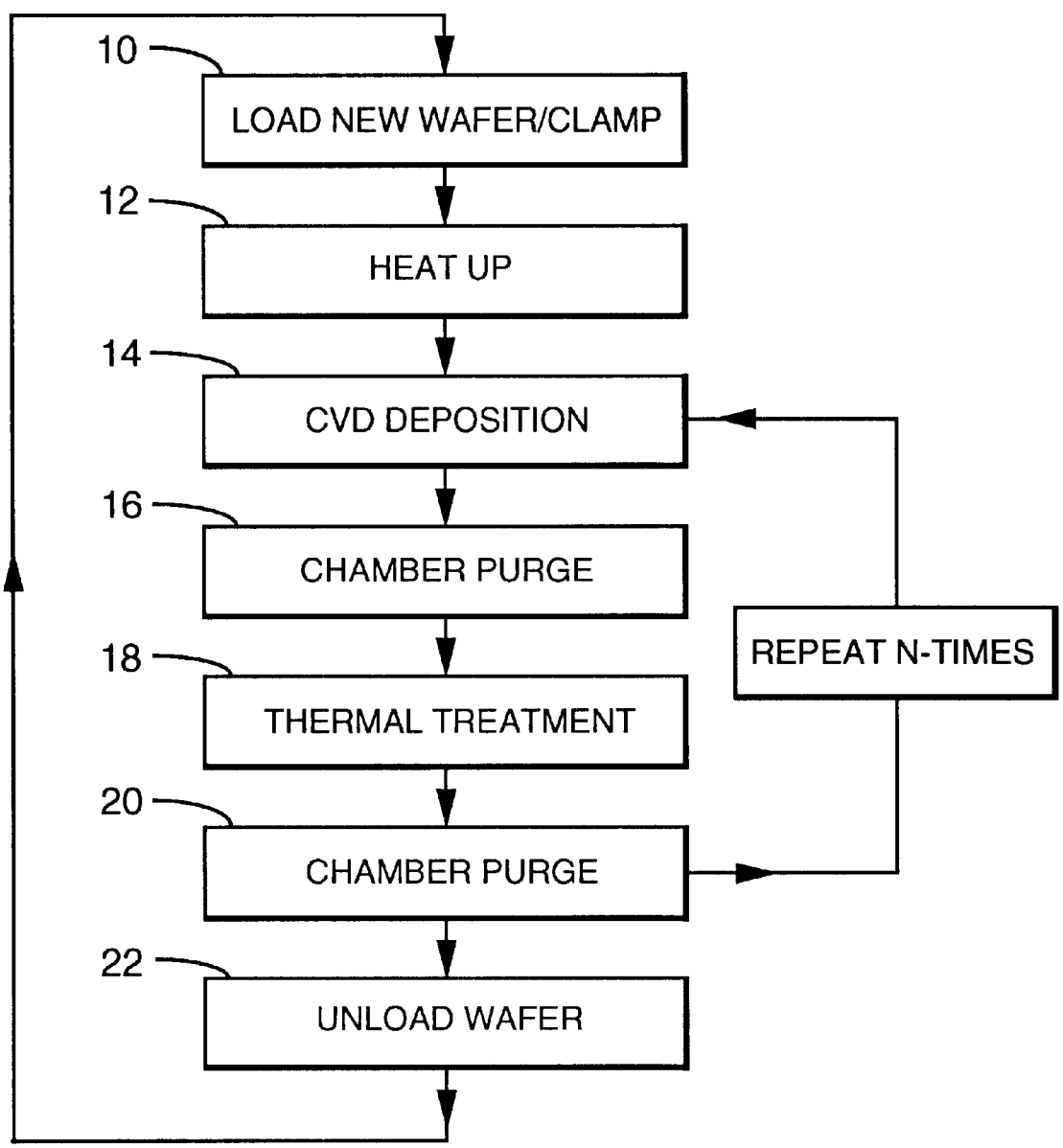
FIG. 1 is a diagram of the process sequence for depositing a diffusion barrier, in accordance with the present invention.

FIG. 1 is a diagram of the process sequence for depositing a diffusion barrier. In step 10, a substrate wafer is loaded onto a deposition system. The substrate is heated to process temperature in step 12. In a first processing step 14, a film of binary transition metal nitride is deposited by chemical vapor deposition. The reaction chamber is then purged in step 16. In a second processing step 18, the deposited binary transition metal nitride film is thermally treated in-situ in a gas containing silicon. The thermal treatment step is conducted at low pressure to create an ultrathin, continuous layer of silicon rich material over the binary transition metal nitride. The reaction chamber is again purged in step 20. Steps 14, 16, 18, and 20 are repeated until the desired number of layers have been formed. The substrate is then unloaded from the deposition system in step 22.

Figure 2:
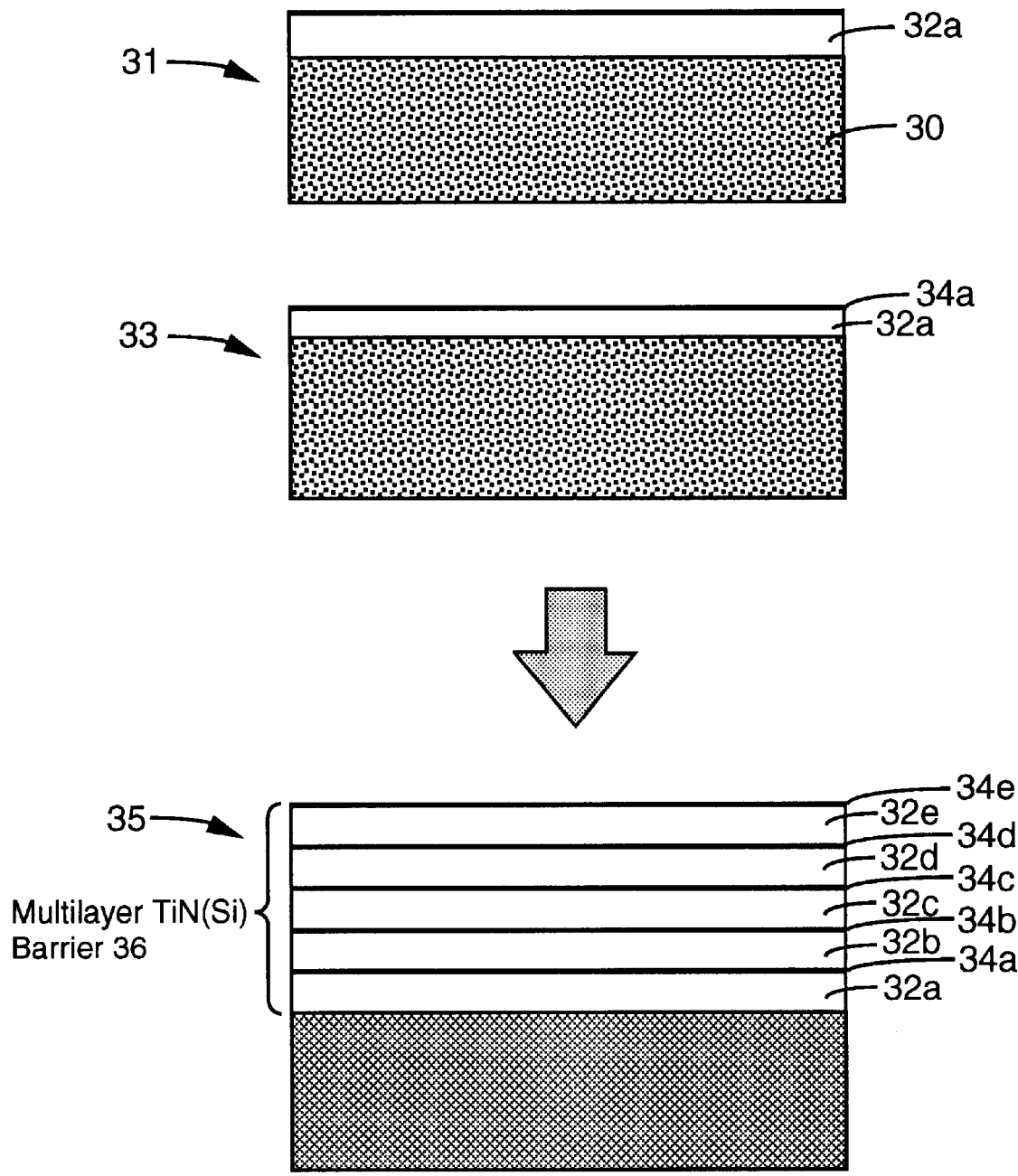
FIG. 2 is a diagram of the process sequence for depositing a multilayer TiN(Si) diffusion barrier, in accordance with an embodiment of the present invention.

FIG. 2 describes a preferred embodiment of the process sequence. In a first processing step 31, a TiN film 32a is deposited on the substrate 30 by metallorganic chemical vapor deposition (MOCVD) from precursors tetrakis (diethylamido) titanium (TDEAT) and ammonia ($NH_3$). The flow of precursors is then discontinued and the reactor is purged with nitrogen. In a second processing step 33, the surface of the TiN film 32a is treated in silane ($SiH_4$) for 5–60 seconds, preferably 10 seconds, at a pressure of 0.1–100 Torr, preferably 2 Torr. The soaking produces a thin sublayer of silicon rich material 34a on the TiN film. Other silicon bearing precursors, such as disilane and trisilane, may be used for processing step 33. In step 35, steps 31 and 33 are repeated to create a multilayer TiN(Si) barrier 36 composed of alternating layers of TiN, sublayers 32a–32e, and silicon rich material, sublayers 34a–34e.

Figure 3:
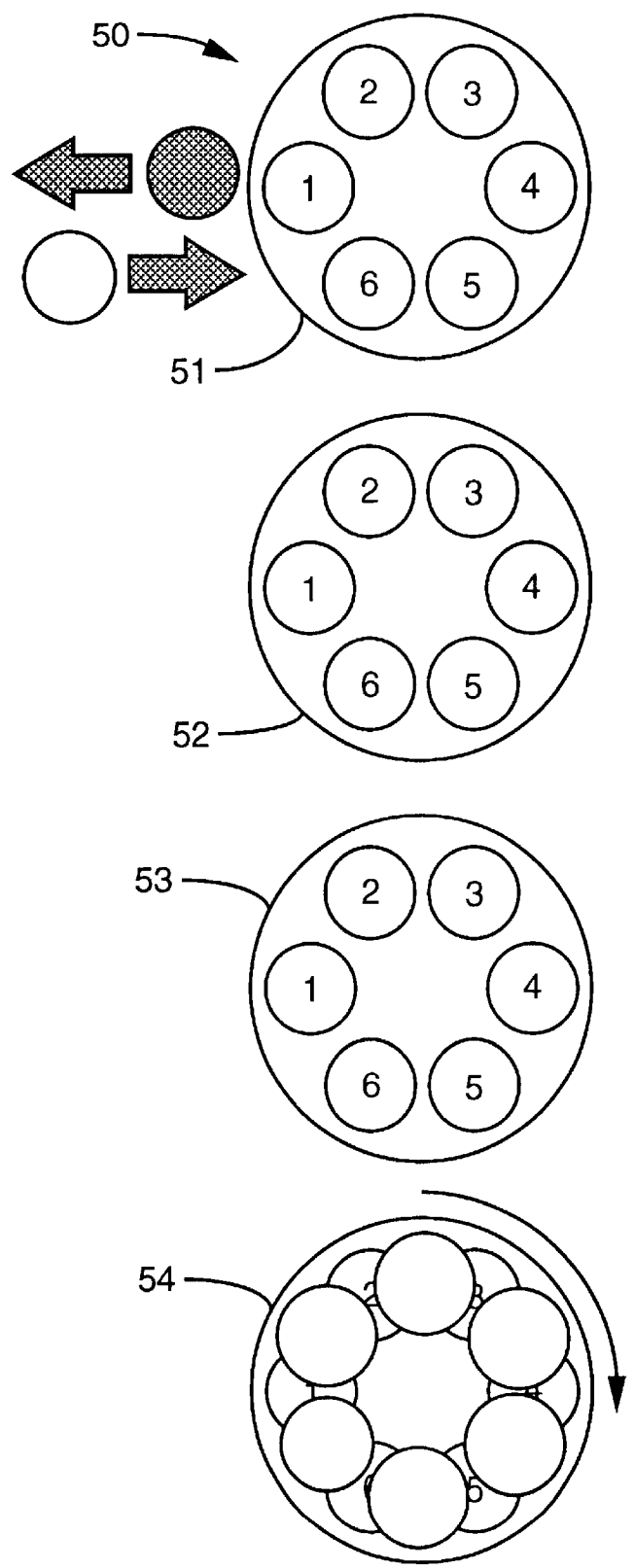
FIG. 3 is a diagram of a deposition system for forming the multilayer TiN(Si) diffiusion barrier of FIG. 2.

FIG. 3 is a schematic diagram of a deposition system 50 for forming multilayer TiN(Si) diffusion barrier 36. Diffusion barrier 36 is deposited by alternating metallorganic chemical vapor deposition (MOCVD) of TiN and post-deposition thermal treatment of the TiN film surface in silane. The deposition is conducted on a conventional multistation deposition system 50 (e.g. Novellus Systems' CVD TiN Prism) having six deposition stations, denoted by circled numerals 1, 2, . . . , 6. Each station consists of a resistively heated pedestal and showerhead. In a first processing step 51, a processed wafer is unloaded from station 1 and a new wafer is loaded, while the other stations are idle. In a second processing step 52, the wafer in station 1 is heated to the processing temperature (typically 325° C.), while the other wafers are deposited with MOCVD TiN using tetrakis (diethylamido) titanium (TDEAT) and ammonia. The reaction chamber is then purged. In a third processing step 53, the wafers in stations 2–5 are soaked in silane while the wafers in stations 1 and 6 are idle. The reaction chamber is then purged. In a fourth processing step 54, all wafers are rotated to their respective next stations, and the entire processing sequence of steps 51–54 is repeated.

Variants of these embodiments can be obtained by treating other transition metal nitrides, such as CVD TaN or CVD $WN_X$ in silane or other silicon containing gases, such as $Si_2H_6$, $Si_3H_6$, $SiH_nX_{4-n}$, where X is a halide.

The present invention offers several advantages. In accordance with the invention, a thin layer of silicon rich material is formed only at the boundary of the transition metal nitride film, thus the silicon rich layer does not affect the overall electrical properties of the diffusion barrier. This effect results in superior suppression of copper diffusion without high barrier resistivity. Further, the formation of high resistivity silicon nitride ternary phases is avoided.

Figure 4:
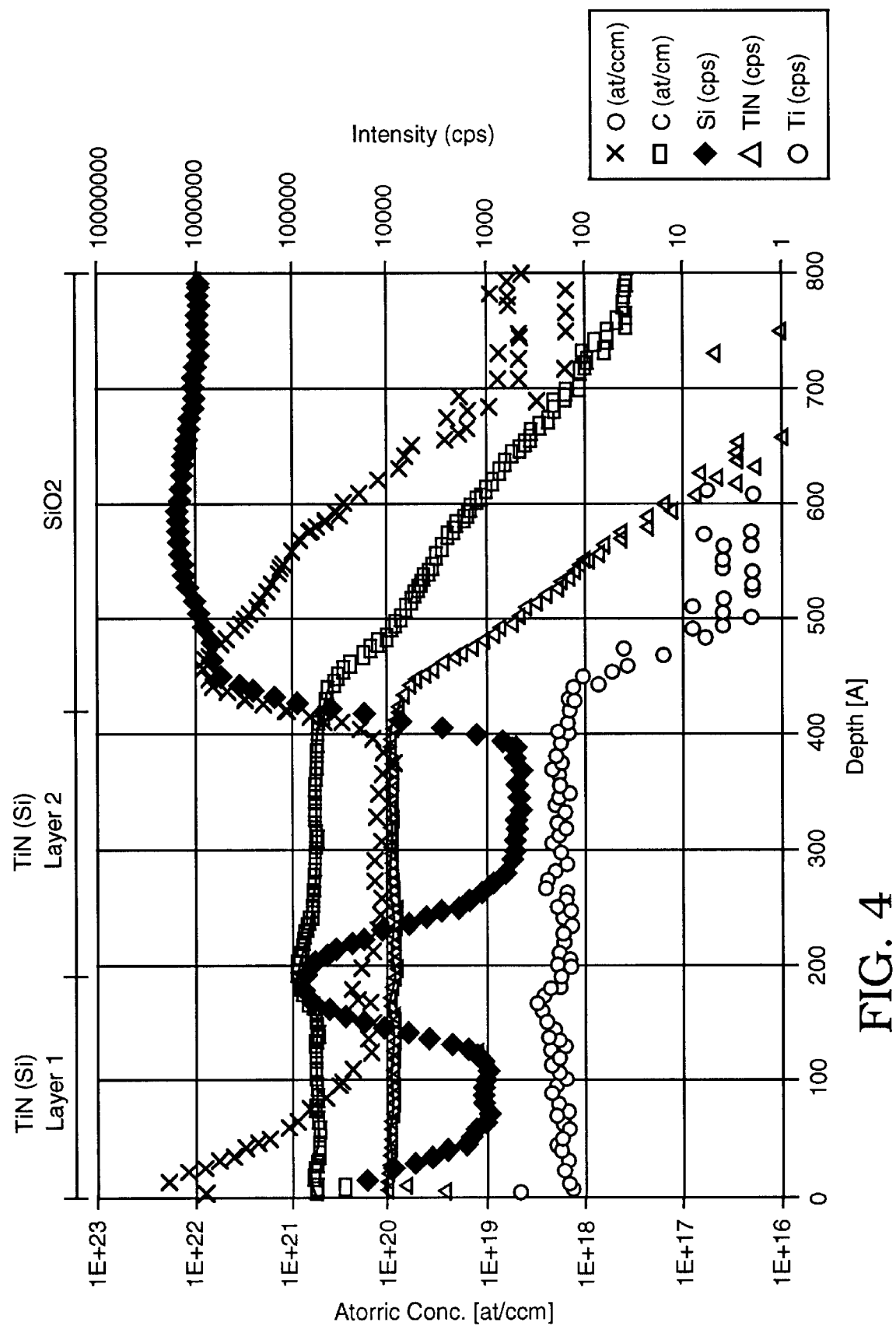
FIG. 4 shows a graph of secondary ion mass spectroscopy profiles of diffusion barriers according to the present invention.

FIG. 4 shows a graph of secondary ion mass spectrometry (SIMS) profiles of two 200 Å thick TiN(Si) layers deposited on a $SiO_2$ substrate by CVD. The horizontal axis is the distance below the surface in angstroms. The left vertical axis is the atomic concentration of oxygen and carbon in atoms per ccm; the right vertical axis is the intensity in counts per second (cps) for silicon, TiN and Ti. The silicon peaks at the surface and 200 Å below the surface represent the silicon-rich layers formed by the exposure of the TiN surface of each layer to $SiH_4$. The underlying $SiO_2$ begins at 400 Å below the surface.

Figure 5:
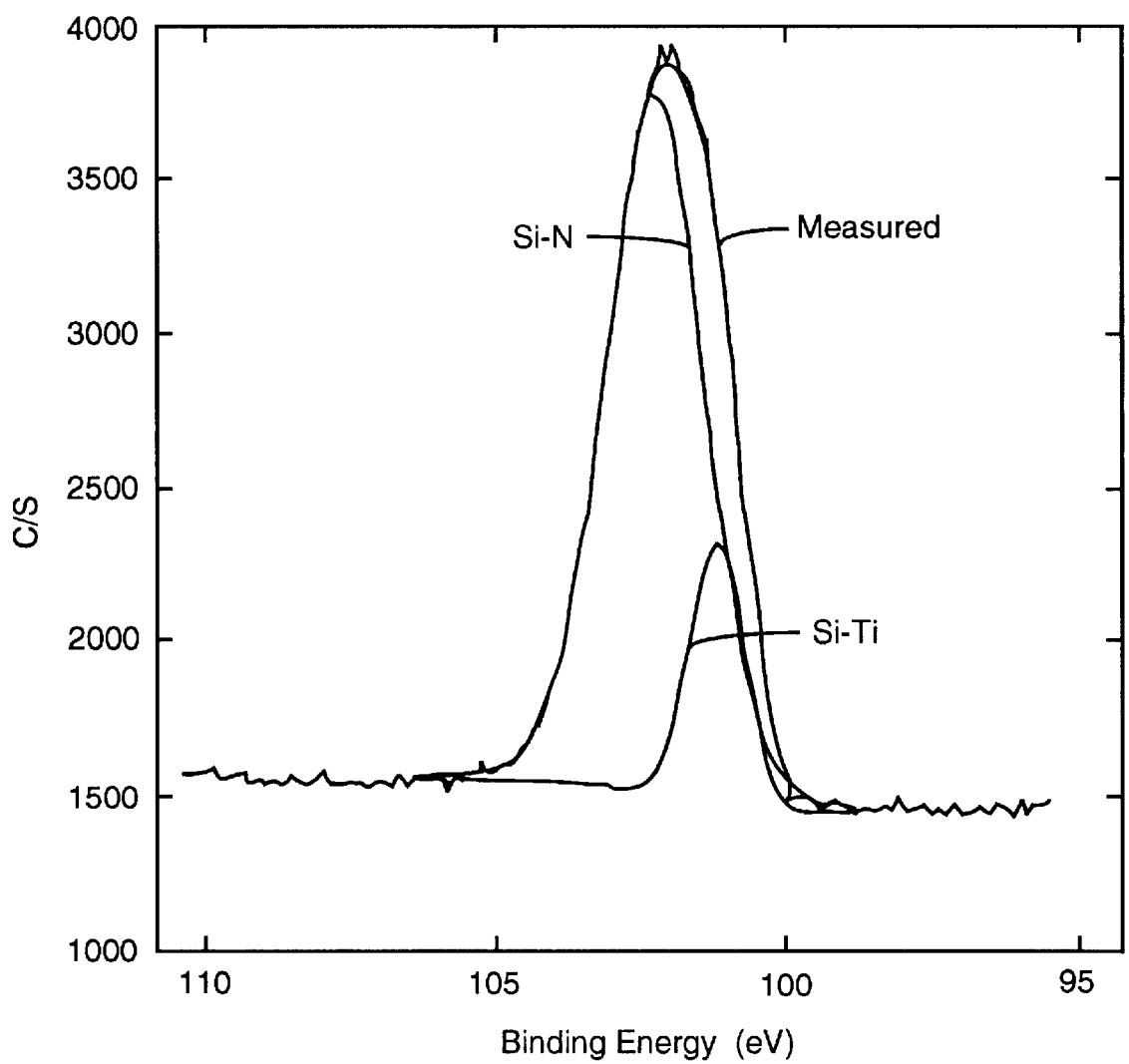
FIG. 5 shows a graph generated by X-ray photoelectron spectroscopy (XPS) showing the chemical state of the silicon incorporated in the TiN(Si) film.

FIG. 5 is a graph generated by X-ray photoelectron spectroscopy (XPS), showing the chemical state of the silicon incorporated in the TiN(Si). The measured silicon data indicates the presence of both Si-N and Si-Ti bonding and silicon nitride ternaries, which are known to have excellent barrier properties.

Figure 6:
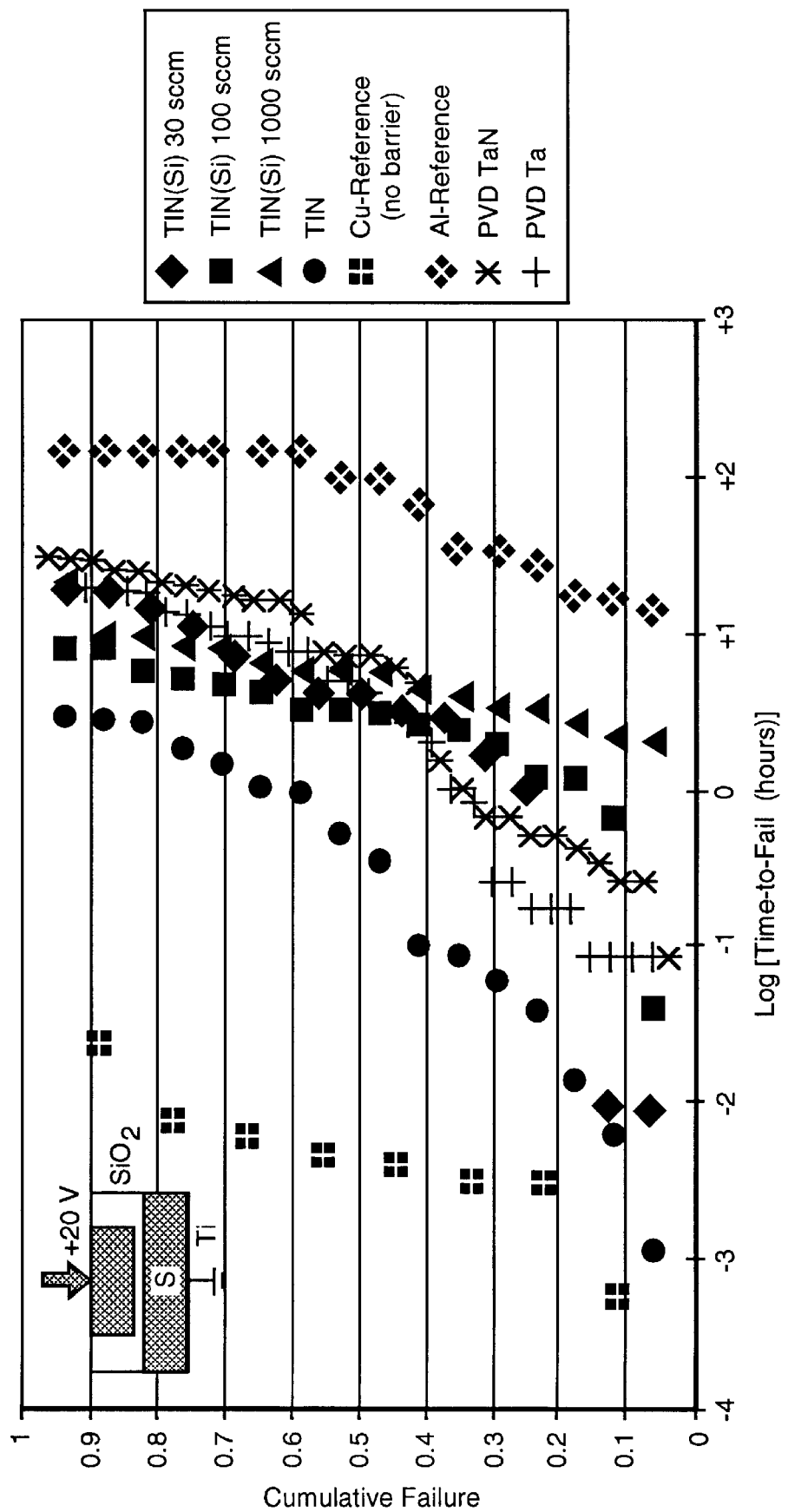
FIG. 6 illustrates the results of bias temperature tests performed on MOS capacitors incorporating the barrier layers of the present invention.

FIG. 6 shows the results of bias-temperature tests that were performed on an MOS capacitor consisting of a sandwich of Cu—$SiO_2$—Si, each layer being 100 Å thick (the test structure is illustrated in the inset). The barrier layer was interposed between the Cu and $SiO_2$. The MOS structure was exposed to a voltage of 2 MV/cm at 250° C. A number of capacitors were tested simultaneously, and failure of a given capacitor was detected as a leakage current in excess of a specified value. The horizontal axis is the $\log_{10}$ of the time to failure in hours; the vertical axis shows the number of failed capacitors as a proportion of the total. TiN(Si) layers were produced using three different flowrates for the $SiH_4$:30 sccm, 100 sccm and 1000 sccm. Note that the TiN layers treated with $SiH_4$ showed a significant improvement as compared with the as-deposited TiN film and were comparable to Ta and TaN barrier layers deposited by physical vapor deposition (PVD).

Another advantage of the invention is that it improves copper wetability of the film surface. This is potentially important for improving copper adhesion and damascene trench fill.

It has been found that the treated TiN film is less susceptible to surface oxidation. This effect may be also important for improving properties of CVD TiN for CVD W plug applications.

Although the invention has been described in terms of certain preferred embodiments, other embodiments apparent to those skilled in the art are also within the scope of this invention.

We claim:

1. A method of creating a diffusion barrier on a substrate comprising:

placing the substrate in a reactor, and forming at least one layer on the substrate by depositing a film of a binary transition metal nitride by chemical vapor deposition from at least two precursor;

gas-purging the reactor of the precursors;

treating a surface of the film of binary transition metal nitride with a gas containing silicon to create a thin layer of silicon rich material; and purging the reactor of the gas containing silicon.

2. The method according to claim 1 wherein the binary transition metal nitride is selected from a group consisting of titanium nitride, tantalum nitride, and tungsten nitride.

3. The method according to claim 1 wherein the binary transition metal nitride is TiN.

4. The method according to claim 1 wherein the precursors are ammonia and tetrakis (dimethylamido) titanium or tetrakis (diethylamido) titanium.

5. The method according to claim 1 wherein the gas containing silicon is selected from a group consisting of silane, $Si_2H_6$, $Si_3H_6$, and $SiH_nX_{4-n}$, where X is a halide.

6. The method according to claim 1 further comprising forming a first layer in a first station of a multistation deposition system, and forming a second layer in a second station of said multistation deposition system.

7. The method according to claim 1 further comprising forming said at least one layer in a single-station deposition system.

8. The method according to claim 1 further comprising treating a surface of the film of binary transition metal nitride with a material containing silicon for 5 to 60 seconds.

9. The method according to claim 1 further comprising treating a surface of the film of binary transition metal nitride with a material containing silicon at 0.1 to 100 Torr.

10. The method according to claim 1 wherein said at least one layer has a thickness of 10 to 200 Å.

11. The method according to claim 1 further comprising depositing a sublayer of binary transition metal nitride on a last layer.

12. The method according to claim 1 wherein the reactor is purged of the precursors and the material containing silicon with nitrogen.

13. The method according to claim 1 wherein 1 to 10 layers are formed.

14. The method of claim 1 wherein the thin layer is sufficient to block grain boundaries of the at least one layer.

15. A method of creating a diffusion barrier on a substrate comprising:

placing the substrate in a single-station deposition system, and forming at least one layer on the substrate in the system by depositing a film of a binary transition metal nitride by chemical vapor deposition from at least two precursors comprising ammonia and tetrakis (diethylamido) titanium;

purging the reactor of the precursors;

treating a surface of the film of binary transition metal nitride with a gas containing silicon to create a thin layer of silicon rich material; and purging the reactor of the gas containing silicon.

16. The method according to claim 15 wherein the binary transition metal nitride is selected from a group consisting of titanium nitride, tantalum nitride, and tungsten nitride.

17. The method according to claim 15 wherein the binary transition metal nitride is TiN.

18. The method according to claim 15 wherein the gas containing silicon is selected from a group consisting of silane, $Si_2H_6$, $Si_3H_6$, and $SiH_nX_{4-n}$, where X is a halide.

19. The method according to claim 15 further comprising treating a surface of the film of binary transition metal nitride with a material containing silicon for 5 to 60 seconds.

20. The method according to claim 15 further comprising treating a surface of the film of binary transition metal nitride with a material containing silicon at 0.1 to 100 Torr.

21. The method according to claim 15 wherein said at least one layer has a thickness of 10 to 200 Å.

22. The method according to claim 15 further comprising depositing a sublayer of binary transition metal nitride on a last layer.

23. The method according to claim 15 wherein the reactor is purged of the precursors and the material containing silicon with nitrogen.

24. The method according to claim 15 wherein 1 to 10 layers are formed.

25. The method of claim 15 wherein the thin layer is sufficient to block grain boundaries of the at least one layer.

* * * * *